(12) United States Patent
Kawaguchi et al.

(10) Patent No.: US 7,090,782 B1
(45) Date of Patent: Aug. 15, 2006

(54) ETCH WITH UNIFORMITY CONTROL

(75) Inventors: Seiji Kawaguchi, San Jose, CA (US); Kenji Takeshita, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 181 days.

(21) Appl. No.: 10/934,324

(22) Filed: Sep. 3, 2004

(51) Int. Cl.
*B44C 1/22* (2006.01)

(52) U.S. Cl. .................. 216/37; 216/79; 216/80; 216/81; 438/714; 438/719; 438/723; 438/725

(58) Field of Classification Search .............. 216/37
See application file for complete search history.

(56) References Cited

U.S. PATENT DOCUMENTS

| | | | |
|---|---|---|---|
| 5,783,482 A * | 7/1998 | Lee et al. | 438/624 |
| 5,879,577 A * | 3/1999 | Weng et al. | 216/92 |
| 6,153,361 A | 11/2000 | Liu et al. | |
| 6,372,634 B1 | 4/2002 | Qiao et al. | 438/637 |
| 6,607,983 B1 | 8/2003 | Chun et al. | 438/691 |
| 6,746,308 B1 | 6/2004 | Bode et al. | 451/8 |
| 6,936,546 B1 * | 8/2005 | Robbins | 438/707 |
| 2003/0013026 A1 | 1/2003 | Lim | 430/30 |
| 2004/0053490 A1 | 3/2004 | Nagao et al. | |
| 2006/0003591 A1 * | 1/2006 | Cheng et al. | 438/725 |

FOREIGN PATENT DOCUMENTS

| | | |
|---|---|---|
| JP | 01055826 | 3/1999 |
| WO | 03/075333 A1 | 9/2003 |

OTHER PUBLICATIONS

International Search Report, dated Jan. 16, 2006.

* cited by examiner

*Primary Examiner*—Nadine G. Norton
*Assistant Examiner*—Eric B. Chen
(74) *Attorney, Agent, or Firm*—Beyer Weaver & Thomas LLP

(57) ABSTRACT

A method of forming semiconductor devices on a wafer is provided. An etch layer is formed over a wafer. A photoresist mask is formed over the etch layer. The photoresist mask is removed only around an outer edge of the wafer to expose the etch layer around the outer edge of the wafer. A deposition gas is provided comprising carbon and hydrogen containing species. A plasma is formed from the deposition gas. A polymer layer is deposited on the exposed etch layer around the outer edge of the wafer, wherein the polymer is formed from the plasma from the deposition gas. The etch layer is etched through the photoresist mask, while consuming the photoresist mask and the polymer deposited on the exposed etch layer around the outer edge of the wafer.

20 Claims, 5 Drawing Sheets

ETCH WITH UNIFORMITY CONTROL

BACKGROUND OF THE INVENTION

The present invention relates to the fabrication of semiconductor-based devices. More particularly, the present invention relates to improved techniques for fabricating semiconductor-based devices with an etched layer.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

Various generations of photoresist are known. 193 nm photoresist and 157 nm photoresist and smaller generation photoresist are desired to provide smaller device sizes and increased device density. 193 nm and 157 nm photoresist may be softer and may be a polymer material.

SUMMARY OF THE INVENTION

To achieve the foregoing and other objects and in accordance with the purpose of the present invention a method of forming semiconductor devices on a wafer is provided. An etch layer is formed over a wafer. A photoresist mask is formed over the etch layer. The photoresist mask is removed only around an outer edge of the wafer to expose the etch layer around the outer edge of the wafer. A deposition gas is provided comprising carbon and hydrogen containing species. A plasma is formed from the deposition gas. A polymer layer is deposited on the exposed etch layer around the outer edge of the wafer, wherein the polymer is formed from the plasma from the deposition gas. The etch layer is etched through the photoresist mask, while consuming the photoresist mask and the polymer deposited on the exposed etch layer around the outer edge of the wafer.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
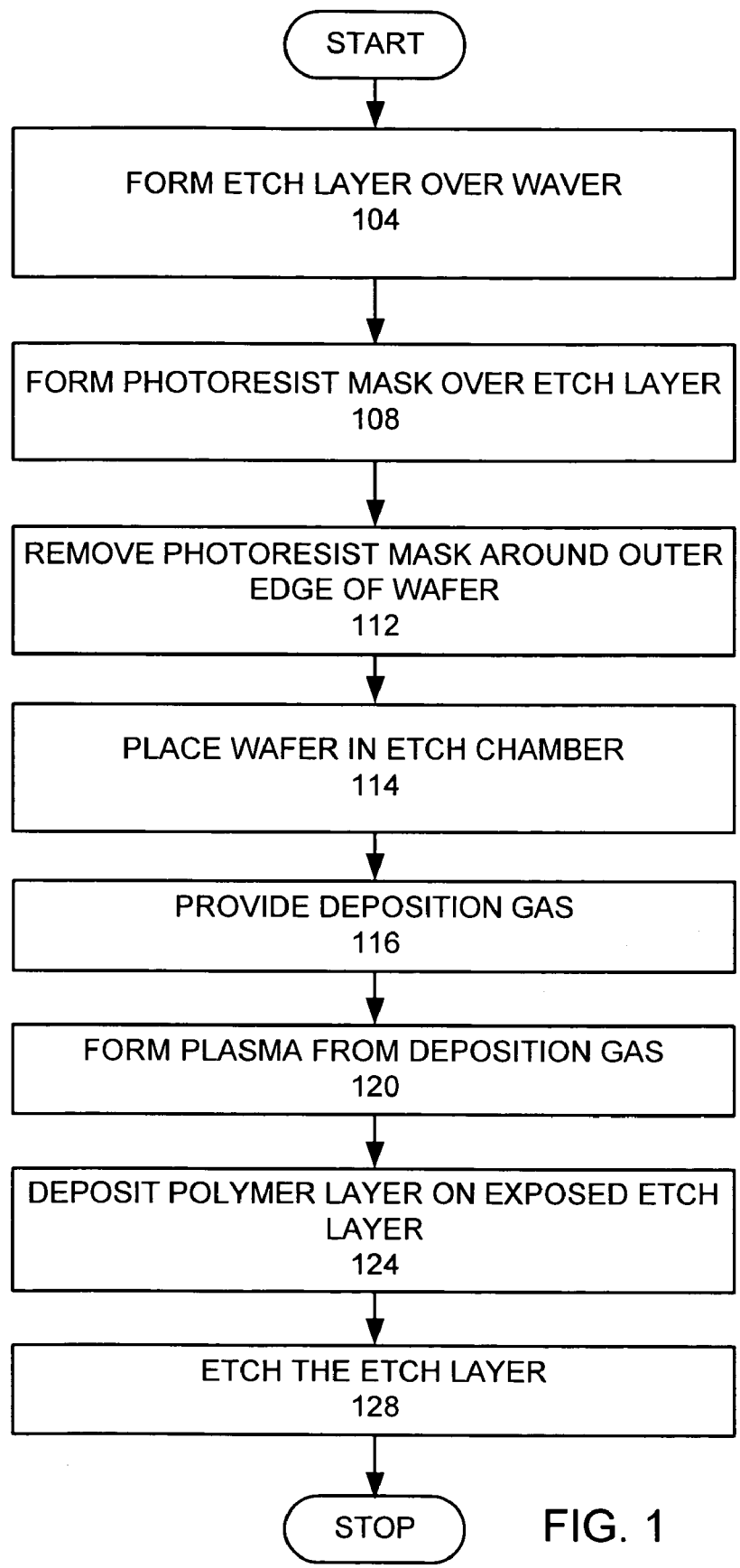
FIG. 1 is a flow chart of a process used in an embodiment of the invention.
Figure 2A:
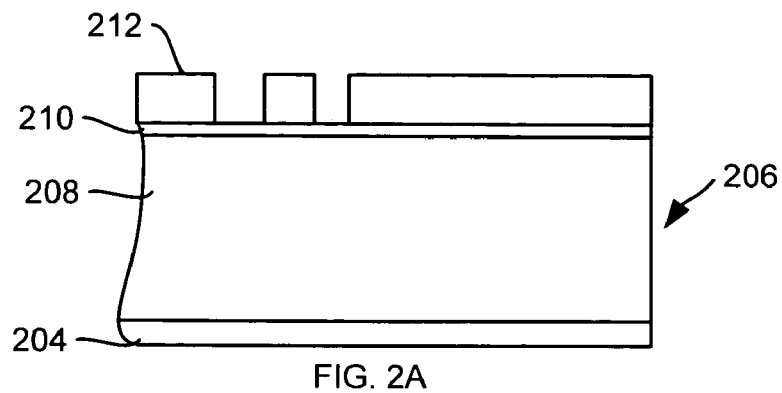
FIGS. 2A–D are schematic side views of a wafer processed according to the process of FIG. 1.

To facilitate understanding, FIG. 1 is a high level flow chart of a process used in an embodiment of the invention. An etch layer is formed over a wafer (step 104). FIG. 2A is a cross-sectional view of a wafer 204 at an outer edge 206 of the wafer 204. An etch layer 208 is formed over the wafer 204 (step 104). The etch layer may be a conductive layer or a dielectric layer. A photoresist mask 212 is formed over the etch layer (208) (step 108). In this embodiment, an antireflective coating (ARC) 210, such as BARC, is placed over the etch layer 208 before the photoresist mask 212 is formed, so that the ARC 214 is between the etch layer 208 and the photoresist mask 212. Other layers may be disposed between the etch layer 208 and the photoresist mask 212.

Figure 2B:
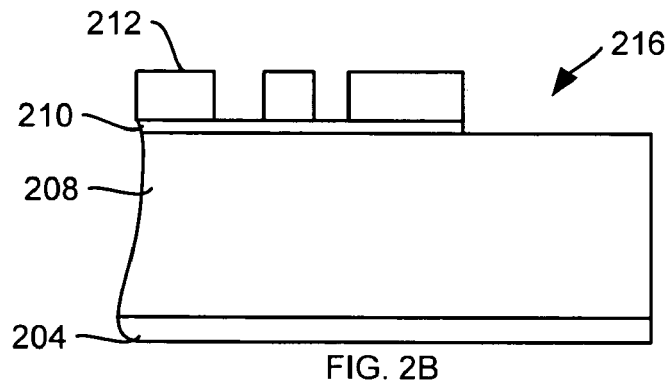
Figure 5:
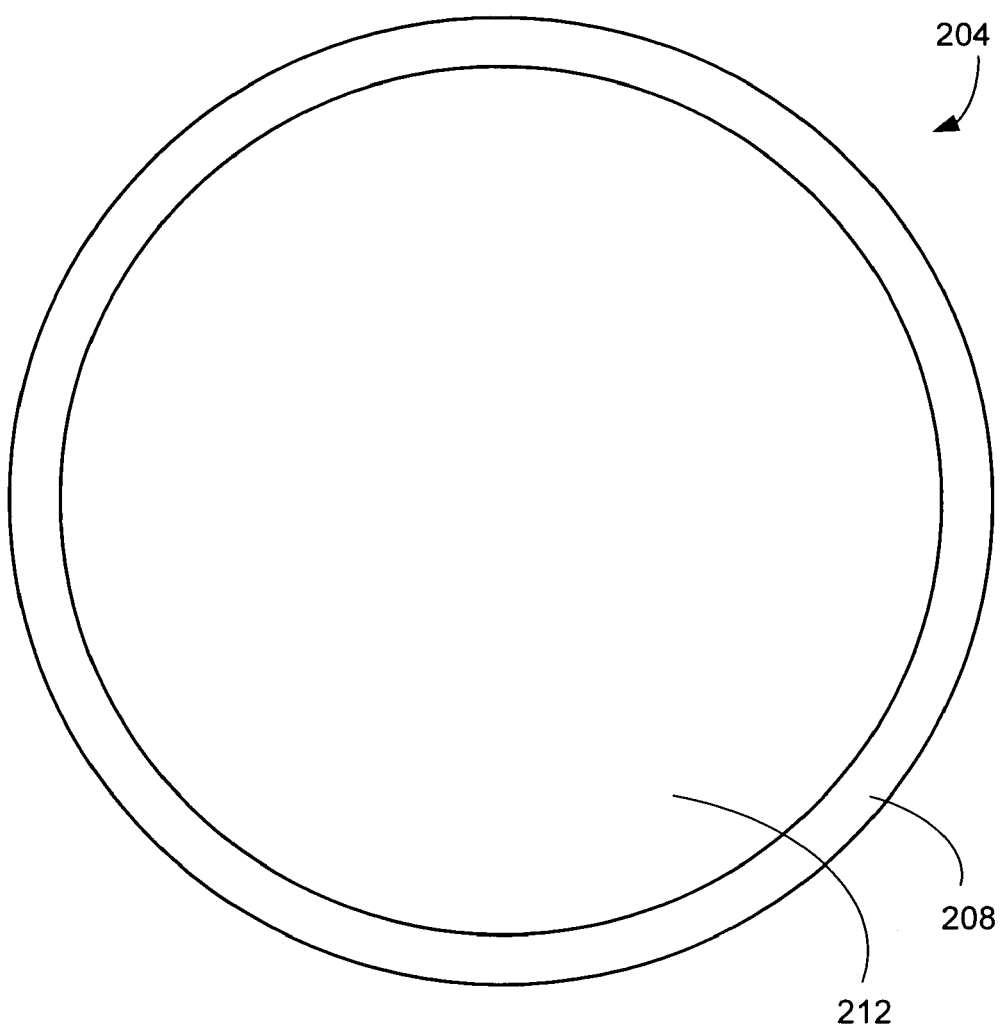
FIG. 5 is a top view of the wafer with the photoresist mask removed around the outer edge of the wafer to expose the etch layer.

The photoresist mask around the other edge of the wafer is removed (step 112), as shown in FIG. 2B to expose the etch layer around the outer edge of the wafer. In this example to expose the etch layer around the outer edge of the wafer, all organic material above the etch layer 216 around the outer edge of the wafer is removed, so that the organic BARC 210 is also removed. FIG. 5 is a top view of the wafer 204 with the photoresist mask 212 removed around the outer edge of the wafer to expose the etch layer 208. Generally, 2–3 mm of organic material such as photoresist and BARC are removed from around the outer edge of the wafer to eliminate a source of particles from peeling.

Figure 3:
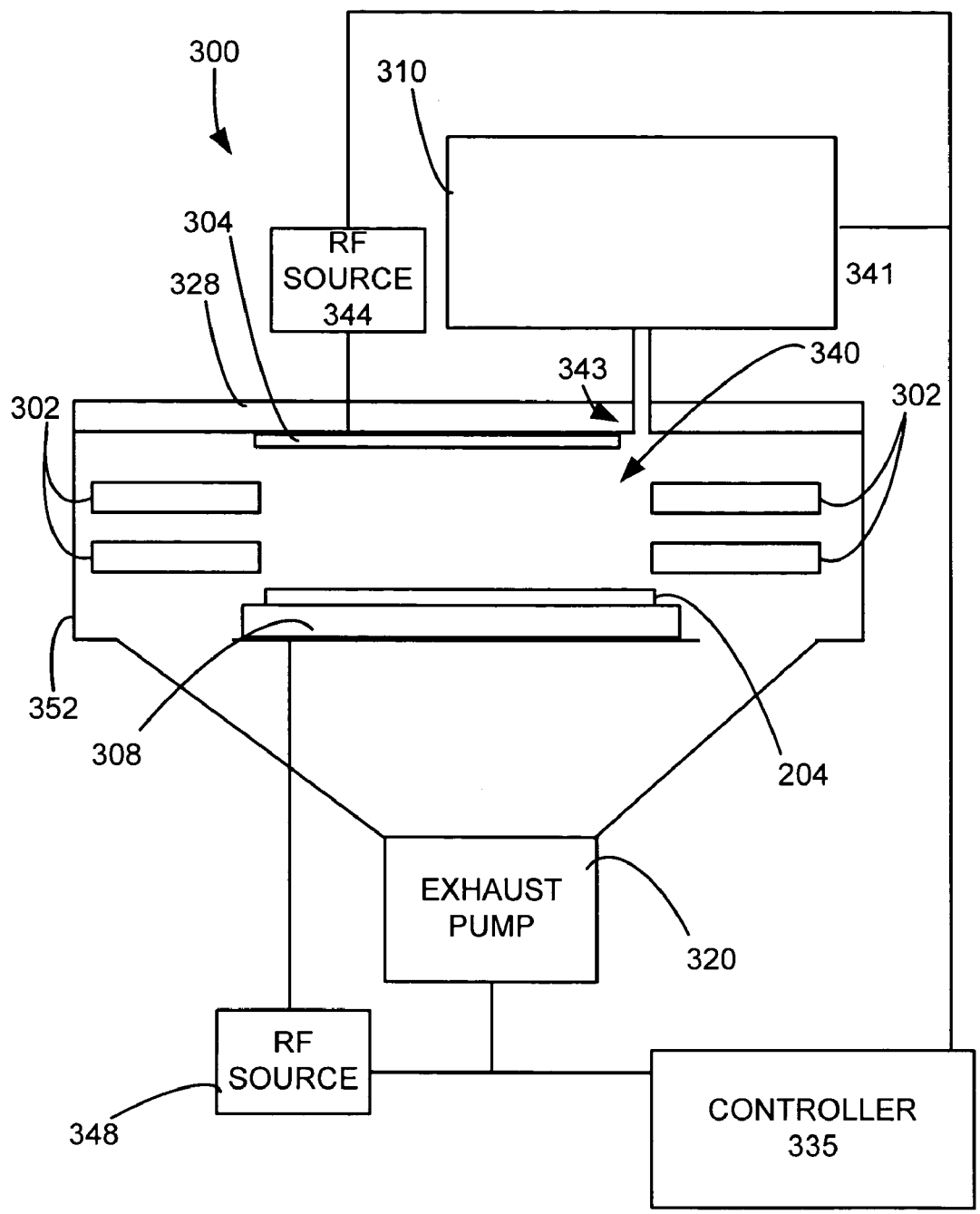
FIG. 3 is a schematic view of a process chamber that may be used in an embodiment of the invention.

In a preferred embodiment, the wafer 204 is placed in an etch chamber (step 114). FIG. 3 is a schematic view of a plasma processing chamber 300 that may be used for depositing the layer, etching, and stripping that may be used in this example. The plasma processing chamber 300 comprises confinement rings 302, an upper electrode 304, a lower electrode 308, a gas source 310, and an exhaust pump 320. Within plasma processing chamber 300, the wafer 204 is positioned upon the lower electrode 308. The lower electrode 308 incorporates a suitable substrate chucking mechanism (e.g., electrostatic, mechanical clamping, or the like) for holding the wafer 204. The reactor top 328 incorporates the upper electrode 304 disposed immediately opposite the lower electrode 308. The upper electrode 304, lower electrode 308, and confinement rings 302 define the confined plasma volume. Gas is supplied to the confined plasma volume by the gas source 310 and is exhausted from the confined plasma volume through the confinement rings 302 and an exhaust port by the exhaust pump 320. A first RF source 344 is electrically connected to the upper electrode 304. A second RF source 348 is electrically connected to the lower electrode 308. Chamber walls 352 surround the confinement rings 302, the upper electrode 304, and the lower electrode 308. Both the first RF source 344 and the second RF source 348 may comprise a 27 MHz power source and a 2 MHz power source. Different combinations of connecting RF power to the electrode are possible. In the case of a 2300 Flex™ or a Exelan HPT or a 2300™ Exelan, made by LAM Research Corporation™ of Fremont, Calif., which may be used in a preferred embodiment of the invention, both the 27 MHz and 2 MHz power sources make up the second RF power source 348 connected to the lower electrode, and the upper electrode is grounded. A controller 335 is controllably connected to the RF sources 344, 348, exhaust pump 320, and the gas source 310.

Figure 4A:
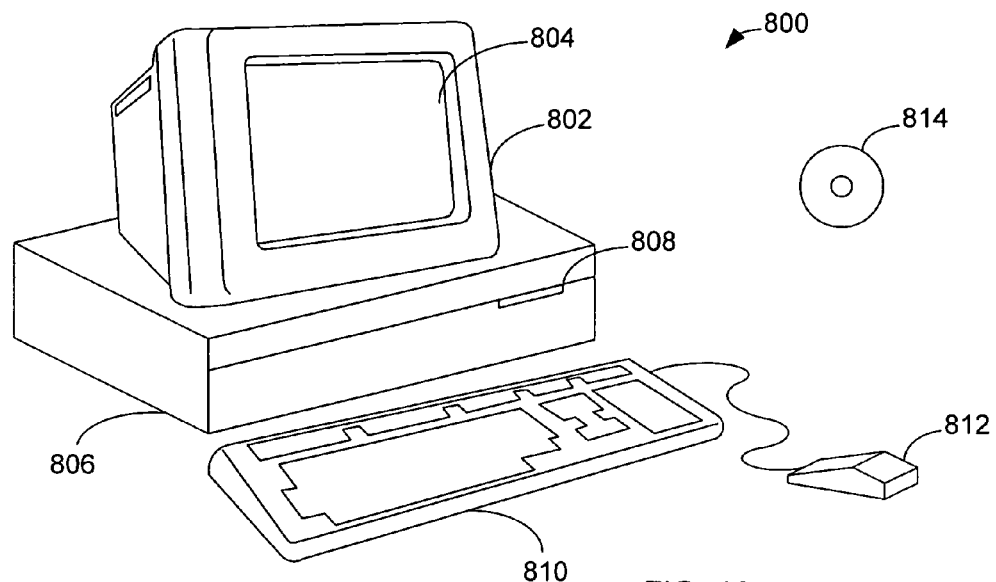
FIGS. 4A–B are schematic views of a computer system that may be used as a controller.
Figure 4B:
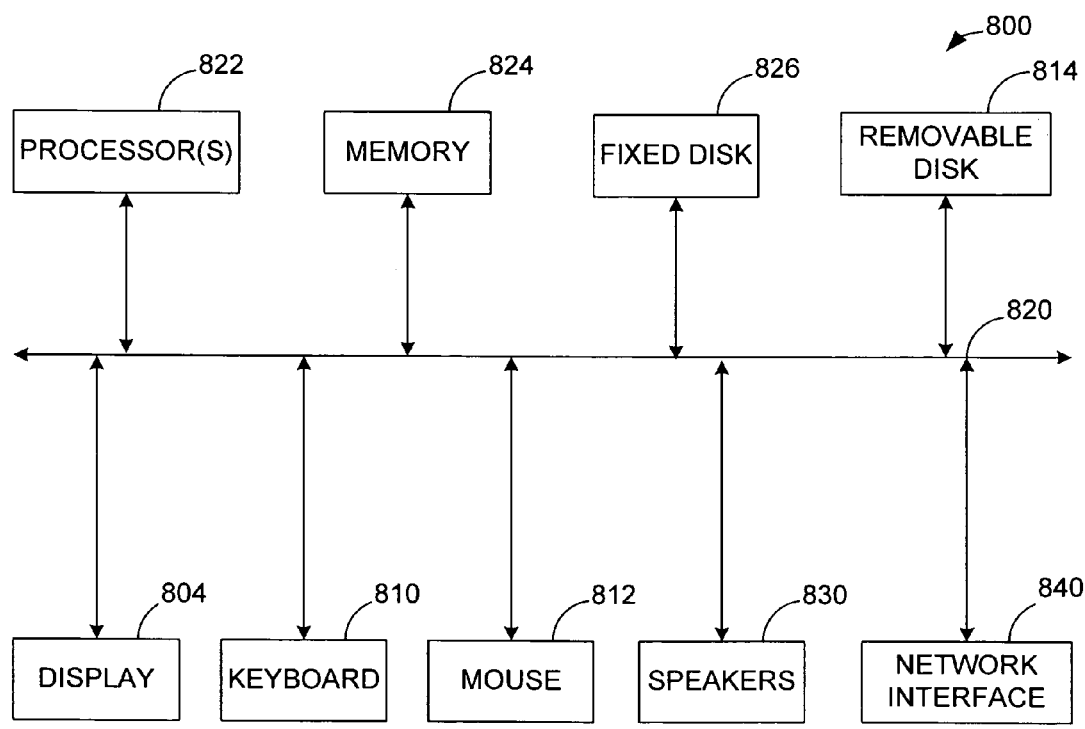

FIGS. 4A and 4B illustrate a computer system 800, which is suitable for implementing a controller 335 used in embodiments of the present invention. FIG. 4A shows one possible physical form of the computer system. Of course, the computer system may have many physical forms ranging from an integrated circuit, a printed circuit board, and a small handheld device up to a huge super computer. Computer system 800 includes a monitor 802, a display 804, a housing 806, a disk drive 808, a keyboard 810, and a mouse 812. Disk 814 is a computer-readable medium used to transfer data to and from computer system 800.

FIG. 4B is an example of a block diagram for computer system 800. Attached to system bus 820 is a wide variety of subsystems. Processor(s) 822 (also referred to as central processing units, or CPUs) are coupled to storage devices, including memory 824. Memory 824 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 826 is also coupled bi-directionally to CPU 822; it provides additional data storage capacity and may also include any of the computer-readable media described below. Fixed disk 826 may be used to store programs, data, and the like and is typically a secondary storage medium (such as a hard disk) that is slower than primary storage. It will be appreciated that the information retained within fixed disk 826 may, in appropriate cases, be incorporated in standard fashion as virtual memory in memory 824. Removable disk 814 may take the form of any of the computer-readable media described below.

CPU 822 is also coupled to a variety of input/output devices, such as display 804, keyboard 810, mouse 812 and speakers 830. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 822 optionally may be coupled to another computer or telecommunications network using network interface 840. With such a network interface, it is contemplated that the CPU might receive information from the network, or might output information to the network in the course of performing the above-described method steps. Furthermore, method embodiments of the present invention may execute solely upon CPU 822 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: flash memory cards, magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

A deposition gas is provided into the etch chamber (step 116). The deposition gas comprises one or more (at least one) species that allows the formation of polymer. This would require carbon and hydrogen containing species. In addition, it is desirable that the deposition gas has a fluorine containing species.

Figure 2C:
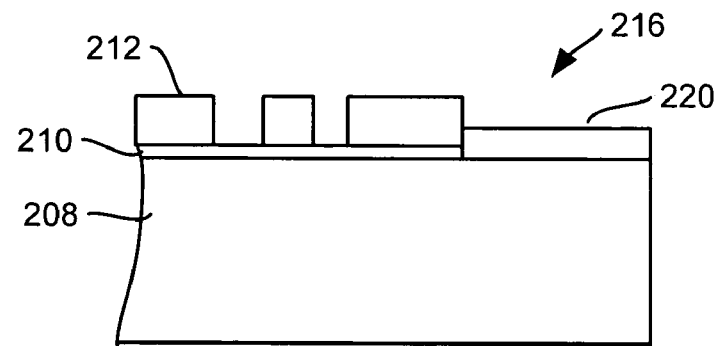

A plasma is formed from the deposition gas (step 120). Power from the RF power sources is used to energize the deposition gas to form a plasma. A polymer layer is deposited on the exposed etch layer around the outer edge of the wafer, where the polymer is formed from the plasma from the deposition gas (step 124). FIG. 2C is a cross-sectional view of part of the wafer 204 after the polymer 220 has been deposited on the exposed etch layer around the outer edge of the wafer 216. Although the deposited polymer 220 is only shown as being deposited on the etch on the outer edge of the wafer 216, some deposition processes may deposit the polymer over the entire wafer surface. It is desirable to have as much control as possible to best limit the deposition of the polymer to the outer edge of the wafer 216.

Figure 2D:
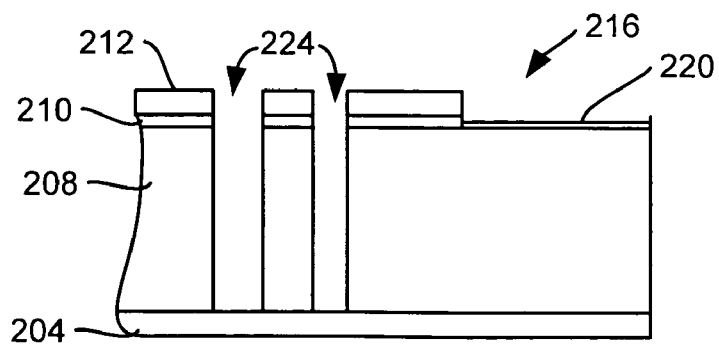

The dielectric layer is etched (step 128). FIG. 2D is a cross-sectional view of the wafer 204 after features 224 have been etched into the dielectric layer 208.

Without wishing to be bound by theory, it is believed that the presence of the polymer over the exposed dielectric layer on the outer edge of the wafer provides a more uniform etch across the wafer, with etch depth uniformity and profile variation uniformity. It is believed that without the deposited layer, the etch layer is directly exposed to plasma, which causes a greater consumption of etching ion and radical species during the etch process than consumption in other areas of the wafer, thus causing the etch rate nearer to the edge of the wafer to be slower than the etch rate closer to the middle of the wafer. In addition, the feature profile near the edge of the wafer tends to bow due to lack of polymer source for side protection supplied from the exposed areas at the outer edge of the wafer. Providing the protective polymer layer over the exposed etch layer at the outer edge of the wafer, both protects the etch layer at the outer edge to reduce the consumption of etching ions and radical species and provides a polymer source at the outer edge to provide a more uniform etch and reduce bowing.

It is found that providing a deposition gas with carbon, hydrogen, and fluorine species formed hydro-fluorocarboned polymer. It has been found that such polymers have provided the best results.

It would be preferred to selectively deposit the deposition layer on the etch layer with respect to the photoresist mask. It would be more preferable to selectively deposit the deposition layer on the exposed etch layer on the outer edge of the wafer.

EXAMPLE

In one example of the invention, an etch layers of SiC, then SiCOH, and then TEOS are deposited on a silicon wafer (step 104). An ARC layer of resist like organic material is formed over the etch layer. A photoresist mask is formed on the ARC layer, which is over the etch layer (step 108). In this example, the photoresist mask is made of preferably 248 nm photoresist, such as KrF, is used. In other embodiments, other photoresist materials such as i-line, and 193 nm and shorter wavelength photoresists, such as ArF, may be used. Photoresist within 3 mm from the edge of the wafer is removed. A wet stripping using a wet strip resist developer is used to remove the photoresist around the wafer edge (step 112). The wafer is placed in an etch chamber (step 114), which in this example is a dual frequency etching reactor.

Within the etch chamber a deposition gas of 350 sccm Ar, 3.5 sccm $O_2$, and 50 sccm $CH_3F$ is provided into the etch chamber (step 116), where the chamber pressure is maintained at 60 mTorr. A plasma is formed from the deposition gas (step 120). In this example the RF source provides 800 watts at 27 MHz and 200 watts at 2 MHz. In addition, the lower electrode temperature is 20° C., and the helium back side pressure in the chuck is kept at 20 Torr. A polymer layer is deposited on the exposed etch layer around the outer edge of the wafer, where the polymer is formed from the plasma from the deposition gas (step 124). In this example, the polymer is a hydro-fluorocarboned polymer. In addition, in this example, the polymer is deposited over the entire wafer surface, including the exposed etch layer around the outer edge of the wafer. The deposition is provided for 8 seconds in this example.

The etch layer is then etched through the photoresist mask (step 128). In this example, the etch recipe first provides a main etch. Pressure in the main etch is 70 mTorr. 1400 watts are provided at 27 MHz. 1500 watts are provided at 2 MHz. An etch gas flow of 500 sccm Ar, 250 sccm $N_2$, 8 sccm $C_4F_8$, 5 sccm $CH_2F_2$, and 5 sccm $O_2$ is provided which is converted to a plasma for the main etch. An over etch is then provided. The pressure for the over etch is 70 mTorr. 1400 watts are provided at 27 MHz. 1800 watts are provided at 2 MHz. An etch gas flow of 500 sccm Ar, 150 sccm $N_2$, 7 sccm $C_4F_8$, 5 sccm $CH_2F_2$, and 100 sccm CO is provided which is converted to a plasma for the over etch.

The inventive etch, which used an 8 second deposition, as described above and a 55 second main etch was compared with control etch with a 67 second main etch, using the same etch process. The inventive etch provided features at the wafer center with etch depths of 659 Å and at the wafer edge with an etch depth of 663 Å and at 3 mm from the wafer edge with a depth of 672 Å. The control etch provided features at the wafer center with etch depths of 608 Å and at the wafer edge with an etch depth of 580 Å and at 3 mm from the wafer edge with a depth of 555 Å. It should be noted that the inventive etch provides an etch feature that is about 12% greater than the control etch, even though the control etch etched for a longer period. In addition, it should be noted that the variance between the etch depth at the center versus 3 mm from the edge is less for the inventive etch than for the control etch. In addition, comparison of the control etch with the inventive etch found that bowing of the features 3 mm from the wafer edge was reduced by the inventive etch.

It is preferred that the flow ratio of oxygen to carbon and hydrogen containing species gases is between and 0:100 and 1:1. Therefore, in some embodiments no oxygen is present in the deposition gas, so that oxygen is not present during the deposition. It is more preferable that the flow ratio of oxygen to carbon and hydrogen containing species gases is between 0:100 and 1:2. It is most preferred that the flow ratio of oxygen to carbon and hydrogen containing species gases is between 0:100 and 1:10.

A low Carbon to Hydrogen ratio deposition gas could obtain polymer easily. For example, a 1:1 ratio may be obtained using $CHF_3$, and a 1:2 ratio may be obtained using $CH_2F_2$ and a 1:3 ratio may be obtained using $CH_3F$.

Other embodiments may use a 193 nm or small photoresist material.

It is preferred that the power supplied by the higher frequency source be between 50 and 3,000 watts. It is more preferable that the power supplied by the higher frequency source be between 100 and 2,000 watts. It is most preferable that the power supplied by the higher frequency source be between 500 and 1,000 watts.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications and various substitute equivalents as fall within the true spirit and scope of the present invention.

What is claimed is:

1. A method of forming semiconductor devices on a wafer, comprising:
   forming an etch layer over a wafer;
   forming a photoresist mask over the etch layer;
   removing the photoresist mask only around an outer edge of the wafer to expose the etch layer around the outer edge of the wafer;
   providing a deposition gas comprising carbon and hydrogen containing species;
   forming a plasma from the deposition gas;
   depositing a polymer layer on the exposed etch layer around the outer edge of the wafer, wherein the polymer is formed from the plasma from the deposition gas; and
   etching the etch layer through the photoresist mask, while consuming the photoresist mask and the polymer deposited on the exposed etch layer around the outer edge of the wafer.

2. The method, as recited in claim 1, further comprising placing the wafer in an etch chamber after removing the photoresist mask around the outer edge of the wafer, wherein the providing the deposition gas, forming a plasma from the deposition gas, depositing a polymer layer, and etching the etch layer all occur in situ within the etch chamber, and wherein the deposited polymer layer on the exposed etch layer increases etch uniformity across the wafer.

3. The method, as recited in claim 2, wherein the deposition gas further comprises fluorine containing species so that the polymer layer is a hydro-fluorocarboned polymer.

4. The method, as recited in claim 3, wherein removing the photoresist mask only around the outer edge of the wafer, comprises using a wet stripping to remove the photoresist mask only around the outer edge of the wafer.

5. The method, as recited in claim 4, wherein the removing the photoresist mask around the outer edge of the wafer further comprises removing only 2–3 mm of the photoresist around the outer edge of the wafer.

6. The method, as recited in claim 5, wherein a carbon to hydrogen ratio of the deposition gas ranges from 1:1 to 1:3.

7. The method, as recited in claim 6, wherein the deposition gas further comprises oxygen.

8. The method, as recited in claim 7, wherein the carbon, hydrogen, and fluorine containing species is a hydrofluorocarbon.

9. The method, as recited in claim 8, wherein the hydrofluorocarbon is at least one of $CHF_3$, $CH_2F_2$, and $CH_3F$.

10. The method, as recited in claim 9, wherein the etch layer comprises silicon.

11. The method, as recited in claim 10, wherein the etch layer comprises at least one of silicon oxide, SiC, and SiCOH.

12. The method, as recited in claim 11, wherein the deposition gas further comprises Ar, $N_2$, and $C_4F_8$.

13. The method, as recited in claim 1, wherein the deposition gas further comprises fluorine containing species so that the polymer layer is a hydro-fluorocarboned polymer.

14. The method, as recited in claim 1, wherein removing the photoresist mask only around the outer edge of the wafer, comprises using a wet stripping to remove the photoresist mask only around the outer edge of the wafer.

15. The method, as recited in claim 1, wherein the removing the photoresist mask around the outer edge of the wafer further comprises removing only 2–3 mm of the photoresist around the outer edge of the wafer.

16. The method, as recited in claim 1, wherein a carbon to hydrogen ratio of the deposition gas ranges from 1:1 to 1:3.

17. The method, as recited in claim 1, wherein the deposition gas further comprises oxygen.

18. The method, as recited in claim 1, wherein the deposition gas further comprises fluorine and wherein the carbon, hydrogen, and fluorine containing species is a hydrofluorocarbon.

19. The method, as recited in claim 1, wherein the deposition gas comprises at least one of $CHF_3$, $CH_2F_2$, and $CH_3F$.

20. The method, as recited in claim 1, wherein the etch layer comprises silicon.

* * * * *